US012672556B2

(12) United States Patent　　(10) Patent No.:　US 12,672,556 B2
Yoo et al.　　(45) Date of Patent:　Jun. 30, 2026

(54) CLIPS FOR SEMICONDUCTOR PACKAGE AND RELATED METHODS

(71) Applicant: SEMICONDUCTOR COMPONENTS INDUSTRIES, LLC, Phoenix, AZ (US)

(72) Inventors: Inpil Yoo, Unterhaching (DE); Seungwon Im, Seoul (KR); JooYang Eom, Gimpo-si (KR); Jerome Teysseyre, Scottsdale, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 757 days.

(21) Appl. No.: 17/651,621

(22) Filed: Feb. 18, 2022

(65) Prior Publication Data

US 2022/0173022 A1　　Jun. 2, 2022

Related U.S. Application Data

(63) Continuation of application No. 16/677,103, filed on Nov. 7, 2019, now Pat. No. 11,264,311.

(60) Provisional application No. 62/913,894, filed on Oct. 11, 2019.

(51) Int. Cl.
| | |
|---|---|
| *H10W 40/70* | (2026.01) |
| *H10W 70/40* | (2026.01) |
| *H10W 72/30* | (2026.01) |
| *H10W 72/50* | (2026.01) |
| *H10W 72/00* | (2026.01) |
| *H10W 72/60* | (2026.01) |

(52) U.S. Cl.
CPC ....... *H10W 70/461* (2026.01); *H10W 70/466* (2026.01); *H10W 70/481* (2026.01); *H10W 72/30* (2026.01); *H10W 72/50* (2026.01); *H10W 72/07337* (2026.01); *H10W 72/352* (2026.01); *H10W 72/652* (2026.01); *H10W 72/655* (2026.01); *H10W 72/884* (2026.01)

(58) Field of Classification Search
None
See application file for complete search history.

(56) References Cited

U.S. PATENT DOCUMENTS

| | | | | |
|---|---|---|---|---|
| 10,002,821 | B1 * | 6/2018 | Hoegerl | ................ H01L 23/051 |
| 2007/0216013 | A1 * | 9/2007 | Funakoshi | .............. H01L 24/40 |
| | | | | 257/691 |
| 2011/0272826 | A1 | 11/2011 | Holst et al. | |
| 2013/0020694 | A1 * | 1/2013 | Liang | .................... H01L 23/473 |
| | | | | 257/691 |
| 2013/0307156 | A1 | 11/2013 | Bayerer | |

(Continued)

OTHER PUBLICATIONS

Infineon Technologies AG, "HybridPack(TM) DSC (Double Sided Cooling)," Apr. 2016.

(Continued)

*Primary Examiner* — Feifei Yeung Lopez
(74) *Attorney, Agent, or Firm* — IPTechLaw

(57) ABSTRACT

Implementations of a clip may include a first copper layer directly bonded to a first side of a ceramic layer, a second copper layer directly bonded to a second side of the ceramic layer, the second side of the ceramic layer opposite the first side of the ceramic layer, and a plurality of channels partially etched into a thickness of the second copper layer.

15 Claims, 8 Drawing Sheets

(56)         References Cited

U.S. PATENT DOCUMENTS

2015/0116945 A1\*  4/2015  Minamio ............... H01L 25/07
                                                        361/709
2017/0064808 A1\*  3/2017  Rizza ..................... H01L 25/18
2017/0317016 A1   11/2017  Heinrich et al.
2020/0286866 A1\*  9/2020  Kawashima .......... H01L 23/367

OTHER PUBLICATIONS

Infineon Technologies AG, "Double Side Cooled Module," V. 3.3,
Jul. 28, 2017.

\* cited by examiner

CLIPS FOR SEMICONDUCTOR PACKAGE AND RELATED METHODS

CROSS REFERENCE TO RELATED APPLICATIONS

This application is a continuation application of the earlier U.S. Utility Patent Application to Yoo entitled "CLIPS FOR SEMICONDUCTOR PACKAGE AND RELATED METHODS," application Ser. No. 16/677,103, filed Nov. 7, 2019, now pending, which application claims priority U.S. Provisional Patent Application 62/913,894, entitled "CLIPS FOR SEMICONDUCTOR PACKAGE AND RELATED METHODS" to Yoo et al., which was filed on Oct. 11, 2019, the disclosures of each of which are hereby incorporated entirely herein by reference. Accordingly, this application claims the benefit of the filing date of U.S. Provisional Patent Application 62/913,894.

BACKGROUND

1. Technical Field

Aspects of this document relate generally to clips and semiconductor packages including clips.

2. Background

Clips are used in semiconductor packages to provide electrical connections in the semiconductor packages. The clips may be used as an alternative to wire bonding. Clips may be made from copper or other metals.

SUMMARY

Implementations of a clip may include a first copper layer directly bonded to a first side of a ceramic layer, a second copper layer directly bonded to a second side of the ceramic layer, the second side of the ceramic layer opposite the first side of the ceramic layer, and a plurality of channels partially etched into a thickness of the second copper layer.

Implementations of clips may include one, all, or any of the following:

The clip may be a direct bond copper (DBC) clip.

The clip may include one or more fully etched channels through the thickness of the second copper layer.

The plurality of channels may be half etched, and are etched into the second copper layer from a first surface of the second copper layer opposite a second surface of the second copper layer directly bonded to the ceramic layer.

The clip may be configured to be placed over a plurality of semiconductor die and a width of the plurality of channels may be configured to be substantially the same as a width of one or more spaces between the plurality of semiconductor die.

The plurality of channels may be configured to dissipate heat from a plurality of semiconductor die.

A perimeter of the clip may be configured to be smaller than a substrate to which the clip is coupled.

Implementations of a semiconductor package may include a substrate coupled to a first side of one or more semiconductor die and a first direct bond copper (DBC) clip coupled to a second side of the one or more semiconductor die, the first DBC clip including a copper layer directly bonded to the one or more semiconductor die. The first DBC clip may include a plurality of channels partially etched into the copper layer.

Implementations of semiconductor packages may include one, all, or any of the following:

The semiconductor package may include one or more channels fully etched into the copper layer.

The plurality of channels may be directly over one or more spaces between the one or more semiconductor die.

The first DBC clip may be directly coupled to the second side of the one or more semiconductor die.

The semiconductor package may include at least a second DBC clip coupled to the one or more semiconductor die.

The one or more semiconductor die may be configured to be cooled on both the first side and the second side.

The plurality of channels correspond in width and location to one or more spaces between the one or more semiconductor die.

Implementations of a semiconductor package may include a direct bond copper (DBC) substrate coupled to a first side of one or more semiconductor die and a first clip coupled to a second side of one or more semiconductor die, the first clip including a copper layer directly bonded to the one or more semiconductor die. The first clip may include a plurality of heat dissipation channels half etched into the copper layer. The plurality of heat dissipation channels may be directly over one or more spaces between the one or more semiconductor die.

Implementations of semiconductor packages may include one, all, or any of the following:

The one or more semiconductor die may include silicon carbide (SiC).

A sidewall of the plurality of heat dissipation channels may be aligned with a sidewall of a semiconductor die of the one or more semiconductor die.

The semiconductor package may include a second clip and a third clip.

The one or more semiconductor die may be cooled on both the first side of the one or more semiconductor die and the second side of the one or more semiconductor die.

A perimeter of the first clip, a perimeter of the second clip, and a perimeter of the third clip each may be within a perimeter of the DBC substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages and clips will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages and clips, and implementing components and methods, consistent with the intended operation and methods.

Figure 1:
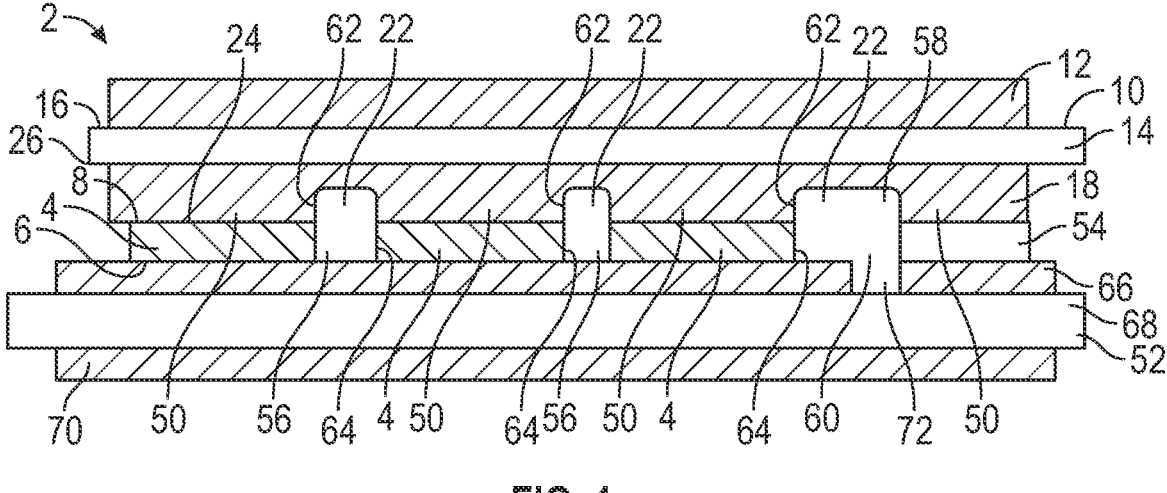
FIG. 1 is a cross-sectional side view of a semiconductor package.

Referring to FIG. 1, a cross-sectional side view of a semiconductor package 2 is illustrated. As illustrated, the semiconductor package may include one or more die 4. In various implementations, the one or more die may include silicon carbide (SiC) or any other type of semiconductor material. In various implementations, the one or more die 4 may include power semiconductor devices. In other implementations, the one or more die 4 may not include power semiconductor devices. While various implementations may include die that are flip chips, in other implementations the semiconductor package 2 does not include any flip chips. The one or more die 4 include a first side 6 and a second side 8 opposing the first side. In various implementations, the semiconductor package 2 includes a clip 10 coupled to the second side 8 of the one or more die 4. In particular implementations, the clip 10 is directly coupled to the second side 8 of the one or more die 4. As used herein, the terms "directly coupled" and "directly bonded" are used to describe the relationship of two elements in direct physical contact as well as the relationship of two elements coupled together through an adhesive or a solder.

Figure 2:
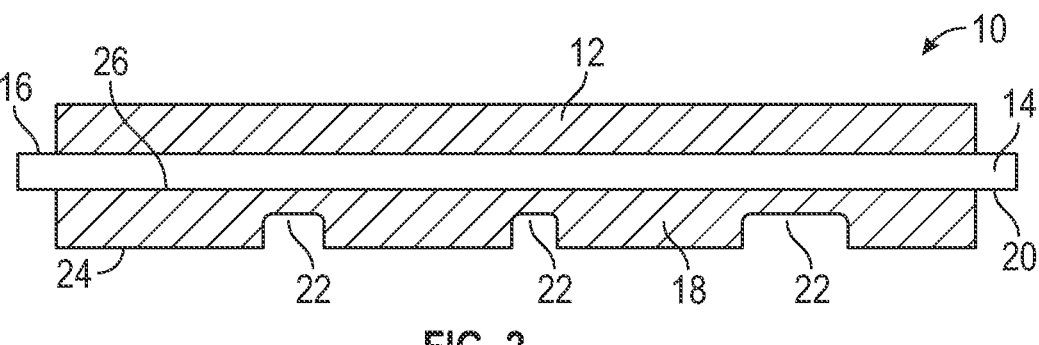
FIG. 2 is a cross-sectional side view of the clip of the semiconductor package of FIG. 1.
Figures 3, 4:
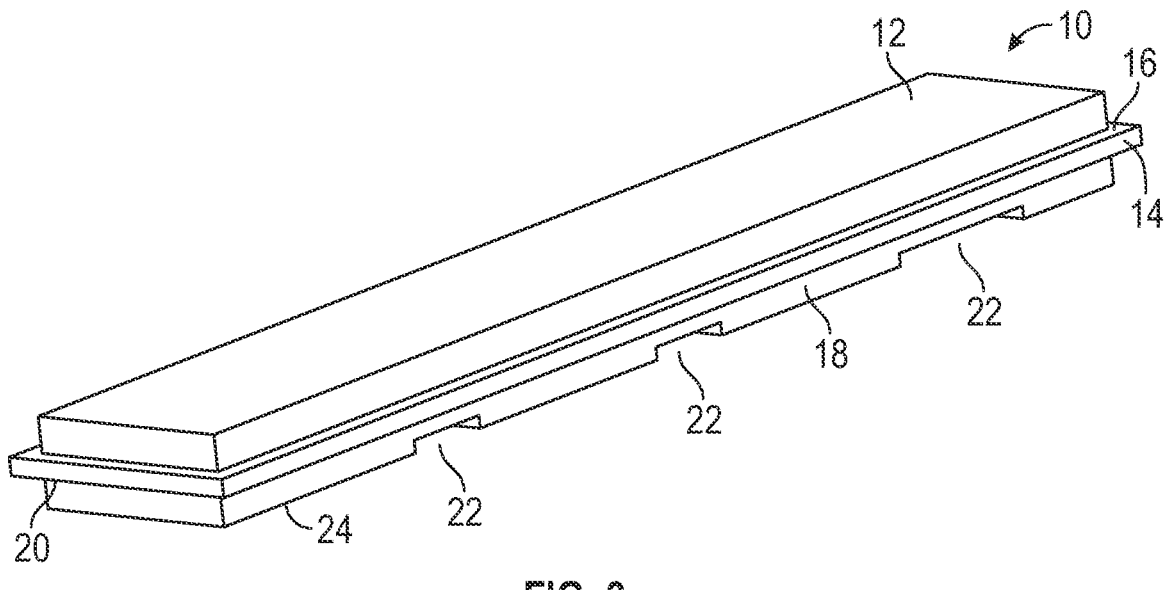
FIG. 3 is a cross-sectional side view of a second implementation of a clip.
FIG. 4 is a perspective view of the clip of FIG. 2.

Referring to FIG. 2, a cross-sectional side view of the clip of the semiconductor package of FIG. 1 is illustrated, and referring to FIG. 3, a perspective view of the clip of FIG. 2 is illustrated. As illustrated by FIGS. 1-3, in various implementations the clip may include a first copper layer 12 directly bonded to a first side 16 of a ceramic layer 14. In other implementations, rather than the first copper layer 12, the clip 10 may include a layer including, by non-limiting example, a metal, metal alloy, electrically conductive material, or group of layers of electrically conductive materials. As illustrated by FIGS. 1-3, a perimeter of the first copper layer 12 facing the ceramic layer 14 may be smaller than and/or may fit within a perimeter of the ceramic layer 14 facing the first copper layer 12. In other implementations, the perimeter of the first copper layer 12 facing the ceramic layer 14 may be the same size or may be larger than the perimeter of the ceramic layer 14 facing the first copper layer 12. In other implementations, the clip may not include a first copper layer and the entire first side 16 of the ceramic layer 14 may be exposed.

In various implementations, the clip includes a second copper layer 18 coupled to a second side 20 of the ceramic layer 14, the second side 20 of the ceramic layer 14 opposite the first side 16 of the ceramic layer 14. In particular implementations, the second copper layer 18 may be directly bonded to the ceramic layer 14. In other implementations, rather than the clip including a second copper layer 18, the clip may include a layer in place of the second copper layer which may include, by non-limiting example, any metal, metal alloy, or another electrically conductive material or set of layers of electrically conductive materials. As illustrated by FIGS. 1-3, a perimeter of the second copper layer 18 facing the ceramic layer 14 may be smaller than and/or may fit within a perimeter of the ceramic layer 14 facing the second copper layer 18. In other implementations, the perimeter of the second copper layer 18 facing the ceramic layer 14 may be the same size or may be larger than the perimeter of the ceramic layer 14 facing the second copper layer 18.

In various implementations of clips having one or more copper layers coupled to the ceramic layer, the clip 10 may be a direct bond copper (DBC) clip. As used herein, a DBC clip refers to a clip, not a substrate, having a ceramic layer directly bonded to at least one copper layer.

As illustrated by FIGS. 1-3, the clip 10 includes a plurality of channels 22 etched into a thickness of the second copper layer 18. The plurality of channels 22 may be heat dissipation channels. In various implementations, the plurality of channels 22 may be half etched and/or partially etched into a thickness of the second copper layer 18. The plurality of channels may be etched into the second copper layer 18 from a first surface 24 of the second copper layer 18. The first surface 24 is opposite the second surface 26 of the second copper layer 18 bonded to the ceramic layer.

Referring to FIG. 4, a cross-sectional side view of a second implementation of a clip is illustrated. Like the clip of FIGS. 1-3, the clip 28 may include a first copper layer 30 directly bonded to a first side 32 of a ceramic layer 34. In other implementations, rather than the first copper layer 30, the clip 28 may include a layer comprising another metal or other material. The ceramic layer 34 and the first copper layer 30 (or non-copper layer) may be the same as the ceramic layer, first copper layer, or non-copper layer disclosed herein in relation to FIGS. 1-3. In other implementations, the clip 28 may not include a first copper layer 30 and the entire first side 32 of the ceramic layer 34 may be exposed.

In various implementations, the clip 28 includes a second copper layer 36 coupled to a second side 38 of the ceramic layer 34, the second side 38 of the ceramic layer 34 opposite the first side 32 of the ceramic layer 34. In particular implementations, the second copper layer 36 may be directly bonded to the ceramic layer 34. In other implementations, rather than the clip including a second copper layer 36, the clip may include a layer in place of the second copper layer which may include any type of metal or other material. In various implementations, a perimeter of the second copper layer 36 facing the ceramic layer 34 may be smaller than and/or may fit within a perimeter of the ceramic layer 34 facing the second copper layer 36. In other implementations, the perimeter of the second copper layer 36 facing the ceramic layer 34 may be the same size or may be larger than the perimeter of the ceramic layer 34 facing the second copper layer 36. Like the clip of FIGS. 1-3, clip 28 may be considered a DBC clip.

As illustrated by FIG. 4, the clip 28 includes a plurality of channels 40 etched into a thickness of the second copper layer 36. The plurality of channels 40 may be heat dissipation channels. In various implementations, the plurality of channels 40 may include one or more fully etched channels through the thickness of the second copper layer 36, such as channel 42. In various implementations, and as illustrated by FIG. 4, the clip 28 may include one or more fully etched channel 42 in combination with one or more half etched and/or partially etched channels 44. In other implementations, the clip 28 may include fully etched channels through the second copper layer (or other non-copper layer in place of the second copper layer) and may not include any partially etched and/or half etched channels through the thickness of the second copper layer (or other non-copper layer in place of the second copper layer). The plurality of channels, whether fully etched, half etched, or partially etched, may be etched into the second copper layer 36 from a first surface 46 of the second copper layer 36. The first surface 46 is opposite the second surface 48 of the second copper layer 36 bonded to the ceramic layer.

Referring back to FIG. 1, in various implementations the clip 10 is designed to be placed over one or more semiconductor die, as illustrated by FIG. 1. While the semiconductor package 2 is illustrated as utilizing clip 10, it is understood that any clip disclosed herein may be used in place of clip 10. As illustrated by FIG. 1, in various implementations the semiconductor package 2 may not include a spacer between the semiconductor die 4 and the clip 10. As illustrated by FIG. 1, in various implementations the portions 50 of the second copper layer 8 that are not etched may be directly coupled to the semiconductor die and/or the substrate 52 through a plurality of solder interconnects. While the solder interconnects are not illustrated between the semiconductor die 4 and the portions 50 of the second copper layer, a solder interconnect 54 is illustrated between the second copper layer 8 and the substrate 52. In other implementations, another interconnect aside from a solder interconnect may be used to couple the second copper layer 8 to the substrate 52. In such implementations, the interconnect may be, by non-limiting example, a stud, post, pillar or any other type of interconnect. Similarly, in other implementations the portions 50 of the second copper layer 8 may be coupled to the semiconductor die 4 without the use of a solder interconnect. Accordingly, in various implementations the plurality of channels 22 may be directly over one or more spaces 56 between the one or more semiconductor die 4.

In various implementations, the width of the plurality of channels 22 may be substantially the same as a width of one or more spaces 56 between the plurality of semiconductor die 4. The width of a channel 58 may also be substantially the same as a width of a space 60 between the semiconductor die 4 and the solder interconnect 54 (or other type of interconnect). Accordingly, the plurality of channels 22 may correspond in width and location to the one or more spaces 56 between the one or more semiconductor die and to the space 58 between one of the one or more semiconductor die 4 and the solder interconnect 54 (or other type of interconnect). In such implementations, the sidewalls 62 of the plurality of channels 22 may be aligned with the sidewalls 64 of the semiconductor die 4. In implementations of semiconductor packages having a clip covering a single die, the sidewalls of the one or more spaces etched into clip may be aligned with the sidewalls of the single semiconductor die.

In other implementations, the widths of the plurality of channels 22 may be larger or smaller than the widths of the spaces 56/58 between the one or more semiconductor die 4 and/or the semiconductor die 4 and an interconnect, such as the solder interconnect 54.

While the implementation illustrated by FIG. 1 illustrate the semiconductor package having clip 10 interconnecting three different semiconductor die 4, in other implementations the clip of the semiconductor package may interconnect two semiconductor die or more than three semiconductor die. In still other implementations, the clip may interconnect a single semiconductor die with the remainder of the semiconductor package. In such implementations, portions around the portion of the second copper layer of the clip (or other layer in place of the copper layer) which is directly over the single semiconductor die may still be etched, including any type of etch disclosed herein. Because the clips may be etched in a variety of patterns, various clips, similar to any of the clips disclosed herein, may be used to interconnect various semiconductor packages having various numbers of semiconductor die. Accordingly, the semiconductor packages disclosed herein may be scalable as the clips the same as or similar to those disclosed herein may be etched to fit the particular semiconductor package.

In the implementations of semiconductor packages disclosed herein, the plurality of channels may dissipate heat from the one or more semiconductor die 4 and improve the thermal performance of the semiconductor package 2. In particular implementations, the plurality of channels may improve the thermal performance by as much as 30%.

Still referring to FIG. 1, in various implementations the semiconductor package 2 includes a substrate 52 coupled to the first side 6 of one or more semiconductor die 4. In particular implementations, the substrate 52 may be a DBC substrate. More specifically, the substrate 52 may include a first copper layer 66 coupled to a ceramic layer 68, and the ceramic layer may be coupled to a second copper layer 70. As illustrated by FIG. 1, in various implementations the first copper layer 66 may be divided by an etch 72. In such implementations, the clip 10 may be coupled over both portions of the first copper layer 66 divided by the etch 72. In various implementations, the semiconductor package 2 is a dual sided cooling package inasmuch as the one or more semiconductor die 4 are cooled on both sides of the semiconductor die, with the clip 10 cooling the second side 8 and the DBC substrate 52 cooling the first side 6. In various implementations disclosed herein, because the semiconductor package includes the etched DBC clip, the semiconductor package may become more reliable and a higher yield of semiconductor packages may be formed when manufacturing the semiconductor package.

Figure 5:
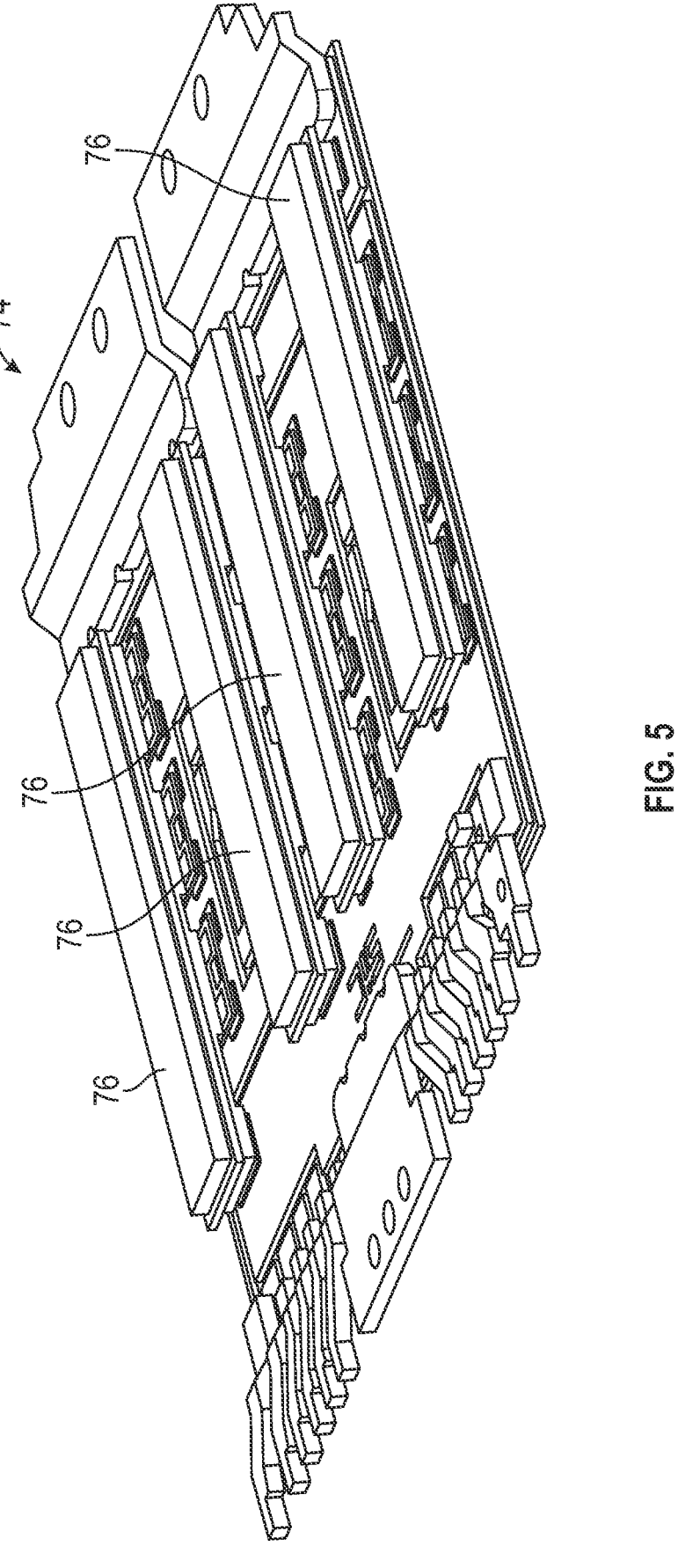
FIG. 5 is a perspective view of a semiconductor package having a plurality of clips.
Figure 6:
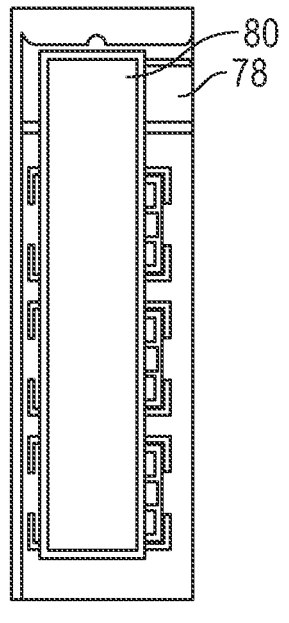
FIG. 6 is a top view of a semiconductor package having a single clip.
Figure 7:
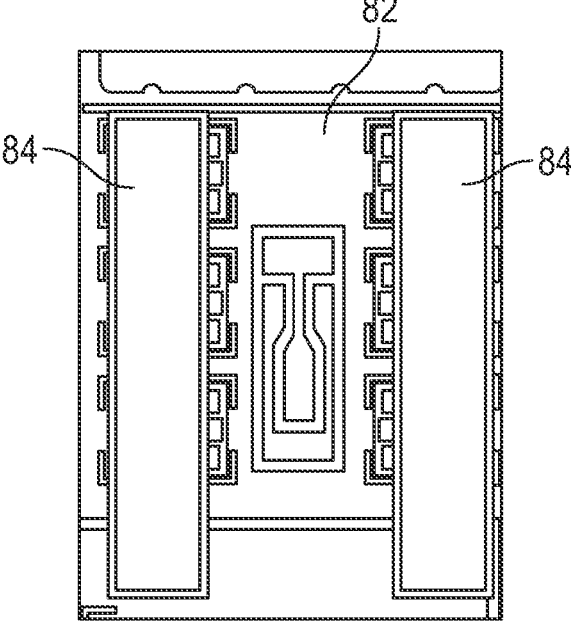
FIG. 7 is a top view of a semiconductor package having two clips in a paralleled configuration.
Figure 8:
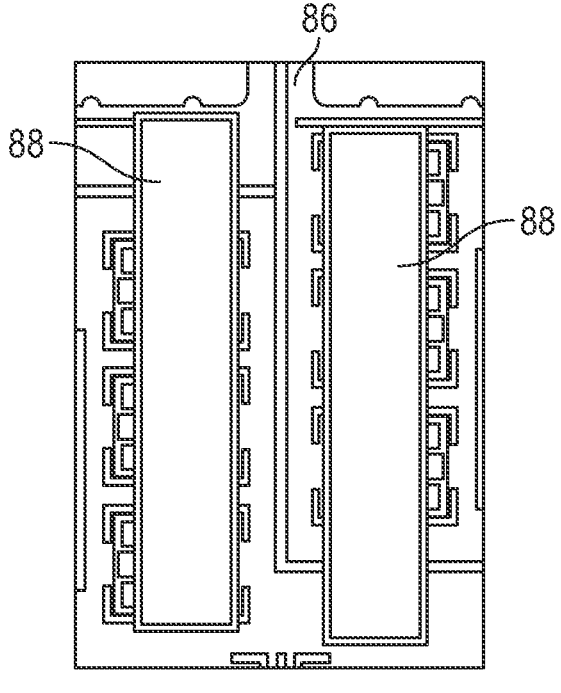
FIG. 8 is a top view of a semiconductor package having two clips in a half bridge configuration.
Figure 9:
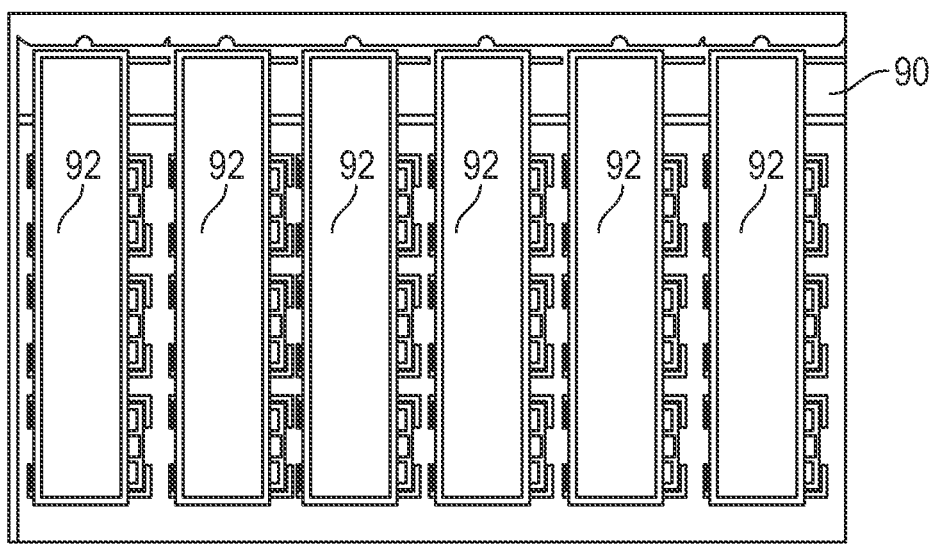
FIG. 9 is a top view of a semiconductor package having six clips.

Referring to FIG. 5, a perspective view of a semiconductor package having a plurality of clips is illustrated. The semiconductor package 74 and the clips 76 may be any type of semiconductor package 74 or clips 76 disclosed herein. In various implementations the semiconductor package 74 may include more than a single clip. As illustrated by FIG. 5, the semiconductor package 74 includes four clips 76. In other implementations, the semiconductor package may include a single clip, such as is illustrated by FIG. 6 which illustrates a top view of a portion of a semiconductor package 78 having a single clip 80. Other implementations of semiconductor packages may include two clips, such as is illustrated by FIGS. 7-8. Referring specifically to FIG. 7, a top view of a portion of a semiconductor package 82 having two clips 84 in a paralleled configuration is illustrated. Referring to FIG. 8, a top view of a portion of a semiconductor package 86 having two clips 88 in a half bridge configuration is illustrated. Other implementations of semiconductor packages may include three clips, five clips, or six clips. Referring to FIG. 9, a top view of a portion of a semiconductor package 90 having six clips 92 is illustrated. In still other implementations, the semiconductor package may include more than six clips. The clips may be arranged in the semiconductor package using any configuration disclosed herein, such as paralleled or half bridge, or may be arranged according to another configuration. As illustrated by FIG. 5, the perimeter of each of the clips 76 may be smaller than a perimeter of the substrate. Further, in implementations of semiconductor packages having multiple clips, a perimeter of each of the clips may fit within a perimeter of the substrate.

Figure 10:
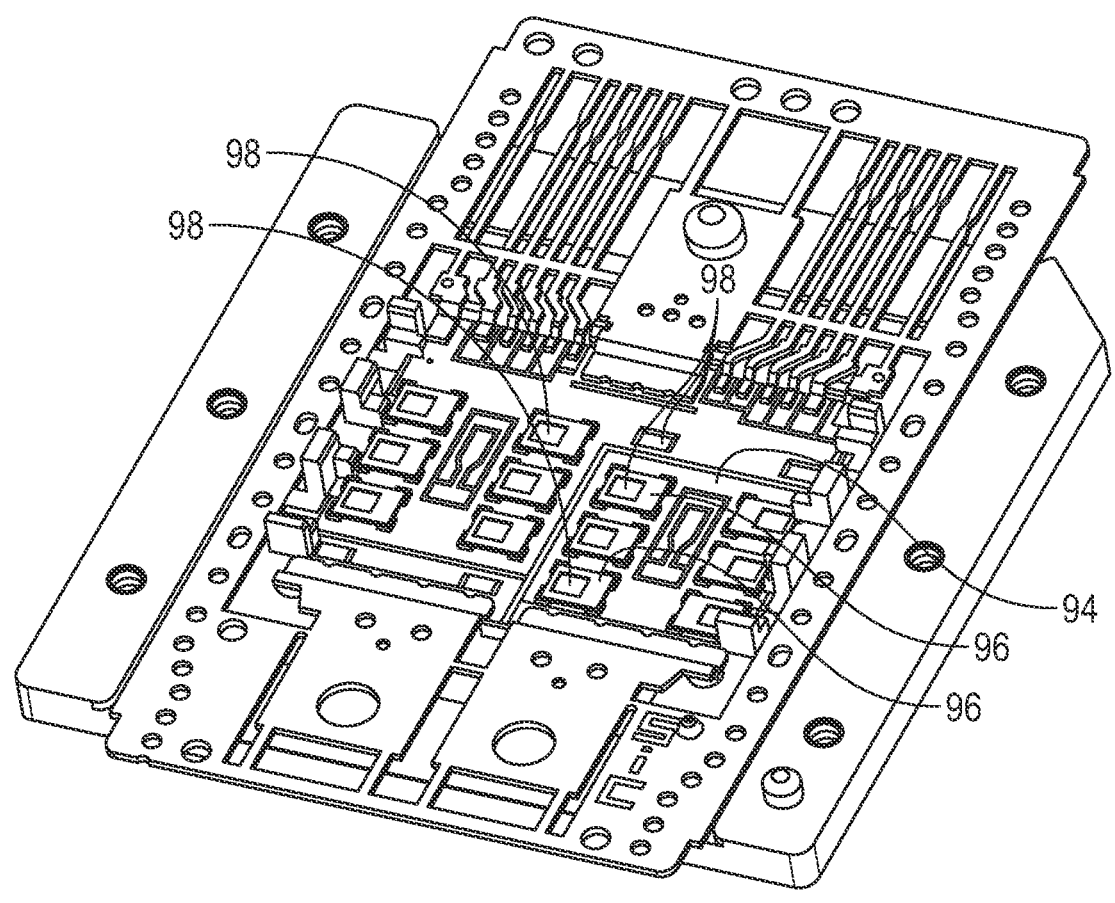
FIG. 10 is a perspective view of a semiconductor package.
Figure 11:
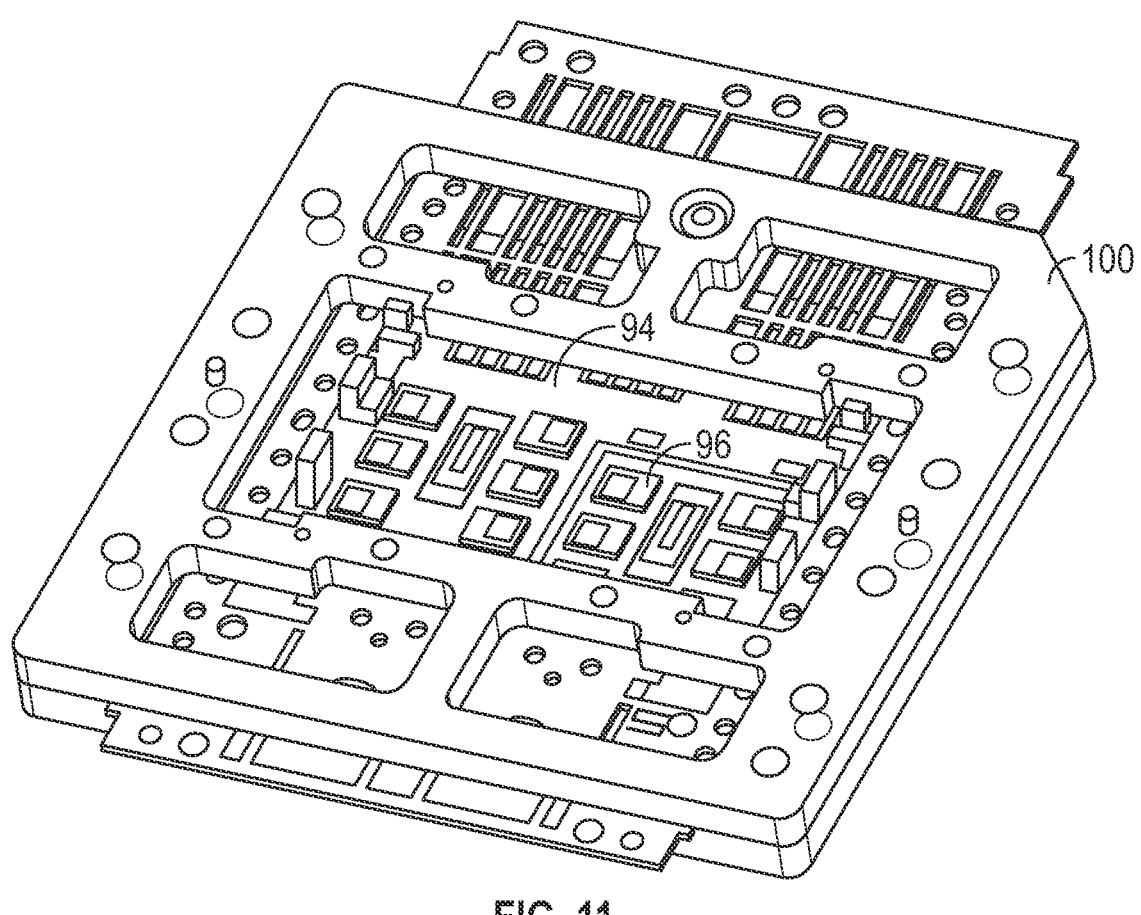
FIG. 11 is a perspective view of the semiconductor package of FIG. 10 with a jig placed thereon.
Figure 12:
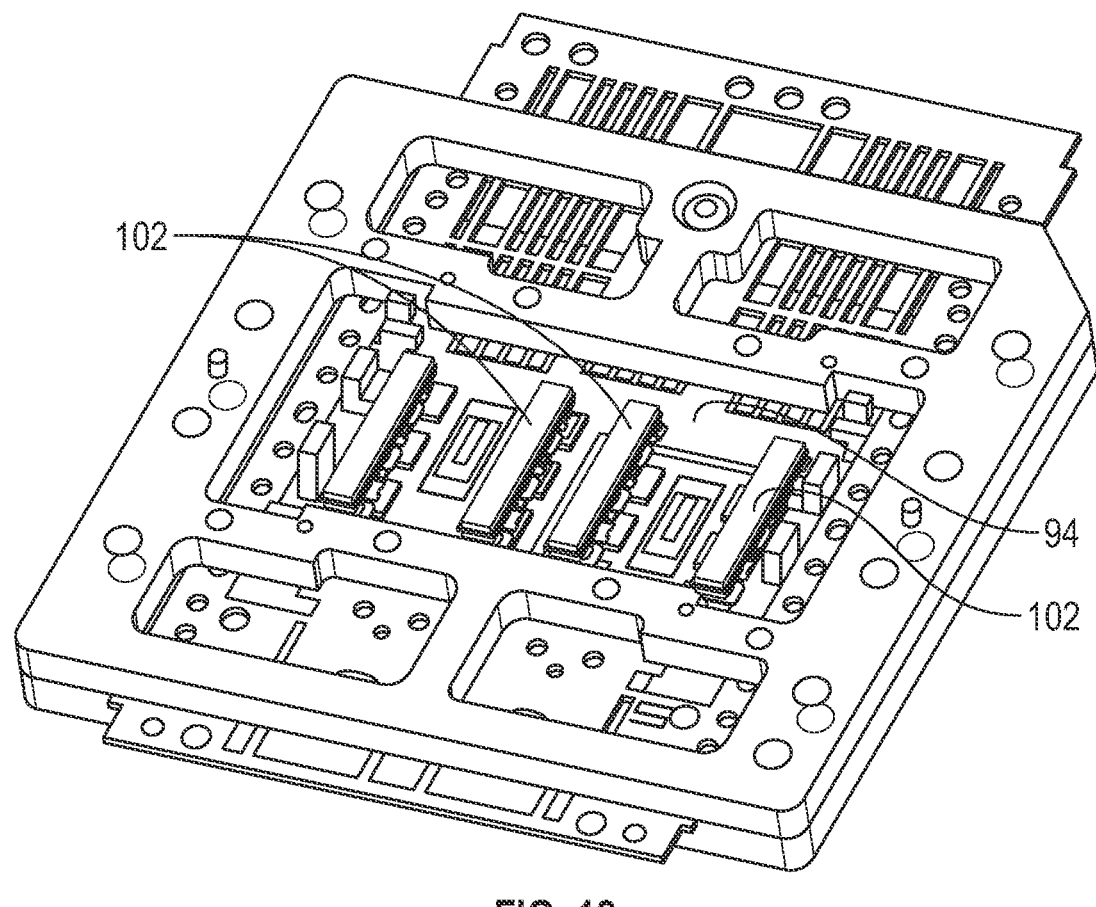
FIG. 12 is a perspective view of the semiconductor package of FIG. 11 with a plurality of clips coupled thereto.

Referring to FIGS. 10-12, semiconductor packages as various points in an implementation of a method of forming a semiconductor package is illustrated. Referring specifically to FIG. 10, a perspective view of a semiconductor package is illustrated. In various implementations, the method of forming the semiconductor package may include coupling one or more semiconductor die 96 onto a substrate 94. The semiconductor die 96 may be any type of semiconductor die disclosed herein and the substrate 94 may be any type of substrate disclosed herein. In various implementations, the method may also include dispensing a plurality of solder pads 98 onto the one or more semiconductor die 96 and/or the substrate 94.

Referring to FIG. 11, a perspective view of the semiconductor package of FIG. 10 with a jig placed thereon is illustrated. In various implementations, the method of forming the semiconductor package may include coupling a jig 100 around the semiconductor die 96 and the substrate 94. In various implementations, the jig 100 may be used to position one or more clips over the semiconductor die 96. Referring to FIG. 12, a perspective view of the semiconductor package of FIG. 11 with a plurality of clips coupled thereto is illustrated. In various implementations, the method of forming a semiconductor package may include coupling one or more clips 102 over the one or more semiconductor die and over a portion of the substrate 94. The one or more clips may be the same as or similar to any clip disclosed herein. In various implementations, the method of forming a semiconductor package may include applying a mold compound over the one or more die, the substrate 94, and/or the one or more clips 102.

In places where the description above refers to particular implementations of semiconductor packages and clips, and implementing components, sub-components, methods and sub-methods, it should be readily apparent that a number of modifications may be made without departing from the spirit thereof and that these implementations, implementing components, sub-components, methods and sub-methods may be applied to other semiconductor packages and clips.

What is claimed is:

1. A semiconductor package comprising:
a direct bond copper (DBC) clip coupled to a plurality of semiconductor die;
a second DBC clip coupled to the plurality of semiconductor die; and
a substrate directly coupled to the DBC clip and the second DBC clip;
wherein the plurality of die are coupled between one of the DBC clip or the second DBC clip and the substrate.

2. The semiconductor package of claim 1, wherein the DBC clip comprises a copper layer directly bonded to the plurality of semiconductor die.

3. The semiconductor package of claim 1, further comprising one or more channels formed into a copper layer of the DBC clip.

4. The semiconductor package of claim 3, wherein the one or more channels are directly over one or more spaces between die of the plurality of semiconductor die.

5. The semiconductor package of claim 1, wherein the second DBC clip and the DBC clip are arranged over the substrate in a side-by-side orientation.

6. The semiconductor package of claim 1, wherein the plurality of semiconductor die are configured to be cooled on both a first side and a second side.

7. The semiconductor package of claim 3, wherein the one or more channels correspond in width and location to one or more spaces between the die of the plurality of semiconductor die.

8. A semiconductor package comprising:
a first direct bond copper (DBC) clip coupled directly over two or more semiconductor die of a plurality of semiconductor die;
a second DBC clip coupled directly over two or more semiconductor die of the plurality of semiconductor die; and
a substrate directly coupled to the first DBC clip and the second DBC clip;
wherein the plurality of die are coupled between one of the first DBC clip or the second DBC clip and the substrate;
wherein the first DBC clip and the second DBC clip are coupled over the plurality of die in a side-by-side orientation; and
wherein the first DBC clip and the second DBC clip each comprise a plurality of channels formed in a copper layer.

9. The semiconductor package of claim 8, wherein the copper layer of the first DBC clip is directly bonded to the plurality of semiconductor die.

10. The semiconductor package of claim 8, further comprising a third DBC clip coupled over the plurality of semiconductor die in a side-by-side orientation with the first DBC clip and the second DBC clip.

11. The semiconductor package of claim 8, wherein the first DBC clip is directly coupled to a substrate through a first solder pad and the second DBC clip is directly coupled to the substrate through a second solder pad.

12. The semiconductor package of claim 8, wherein the plurality of channels extend both partially through and entirely through the copper layer.

13. The semiconductor package of claim 8, wherein the plurality of channels are directly over one or more spaces between the one or more semiconductor die.

14. A semiconductor package comprising:
a direct bond copper (DBC) clip coupled directly over two or more semiconductor die of a plurality of semiconductor die;
a second DBC clip coupled directly over two or more semiconductor die of the plurality of semiconductor die; and
a substrate coupled directly under the plurality of die and directly coupled to the DBC clip and the second DBC clip;
wherein the plurality of die are coupled between one of the DBC clip or the second DBC clip and the substrate.

15. The semiconductor package of claim 14, further comprising a plurality of heat dissipation channels in a copper layer of the DBC clip.

* * * * *